(12) United States Patent
Lin et al.

(10) Patent No.: US 7,235,436 B1
(45) Date of Patent: Jun. 26, 2007

(54) METHOD FOR DOPING STRUCTURES IN FINFET DEVICES

(75) Inventors: Ming-Ren Lin, Cupertino, CA (US); Zoran Krivokapic, Santa Clara, CA (US); Haihong Wang, Fremont, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 412 days.

(21) Appl. No.: 10/614,051

(22) Filed: Jul. 8, 2003

(51) Int. Cl.
*H01L 21/84* (2006.01)

(52) U.S. Cl. .................. 438/154; 438/275; 438/548

(58) Field of Classification Search ............... 438/154, 438/156, 173, 199, 212, 268, 275, 542, 548, 438/558, 563, 567, FOR. 324
See application file for complete search history.

(56) References Cited

U.S. PATENT DOCUMENTS 5,770,490 A * 6/1998 Frenette et al. ............. 438/199
6,667,528 B2 * 12/2003 Cohen et al. ................ 257/469
2004/0048424 A1 * 3/2004 Wu et al. .................... 438/154

FOREIGN PATENT DOCUMENTS

JP           62060220 A  *  3/1987

OTHER PUBLICATIONS

Wolf et al., "Silicon Processing for the VLSI Era: vol. 1—Process Technology," Lattice Press, copyright 1986, pp. 263-264.*
Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.
Yang-Kyu Choi et al., "Nanoscale CMOS Spacer FinFET for the Terabit Era," IEEE Electron Device Letters, vol. 23, No. 1, Jan. 2002, pp. 25-27.

* cited by examiner

*Primary Examiner*—N. Drew Richards
(74) *Attorney, Agent, or Firm*—Harrity Snyder LLP

(57) ABSTRACT

A method for doping fin structures in FinFET devices includes forming a first glass layer on the fin structure of a first area and a second area. The method further includes removing the first glass layer from the second area, forming a second glass layer on the fin structure of the first area and the second area, and annealing the first area and the second area to dope the fin structures.

14 Claims, 10 Drawing Sheets

US 7,235,436 B1

METHOD FOR DOPING STRUCTURES IN FINFET DEVICES

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the principles of the invention use doped glass to uniformly dope the fin structure and source/drain regions of FinFET devices. As a result, low source-drain resistance can be achieved.

In accordance with the purpose of this invention as embodied and broadly described herein, a method for forming FinFET devices includes forming a first fin structure, a source region, and a drain region in a first area of a wafer; forming a second fin structure, a source region, and a drain region in a second area of the wafer; forming a phosphosilicate glass layer on the first area and the second area; removing the phosphosilicate glass layer from the second area; forming a boron silicate glass layer on the first area and the second area; annealing the first area and the second area, the annealing causing the first fin structure, source region, and drain region of the first area to be doped with phosphorus and causing the second fin structure, source region, and drain region of the second area to be doped with boron; removing the boron silicate glass layer from the first area and the second area; and removing the phosphosilicate glass layer from the first area.

In another implementation consistent with the present invention, a method for doping a fin structure and source and drain regions in FinFET devices is provided. The method includes forming a first glass layer on the fin structure and source and drain regions of an N-channel device and a P-channel device; removing the first glass layer from the P-channel device; forming a second glass layer on the fin structure and source and drain regions of the N-channel device and the P-channel device, the second glass layer being different than the first glass layer; and annealing the N-channel device and the P-channel device to dope the fin structure and source and drain regions of the N-channel device and the P-channel device.

In yet another implementation consistent with the principles of the invention, a method for doping fin structures in FinFET devices is provided. The method includes forming a first glass layer on the fin structures of a first area and a second area, removing the first glass layer from the second area, forming a second glass layer on the fin structures of the first area and the second area, and annealing the first area and the second area to dope the fin structures.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention use doped glass to uniformly dope the fin structure and source/drain regions of FinFET devices. As a result, low source-drain resistance can be achieved.

Exemplary Processing

Figure 1:
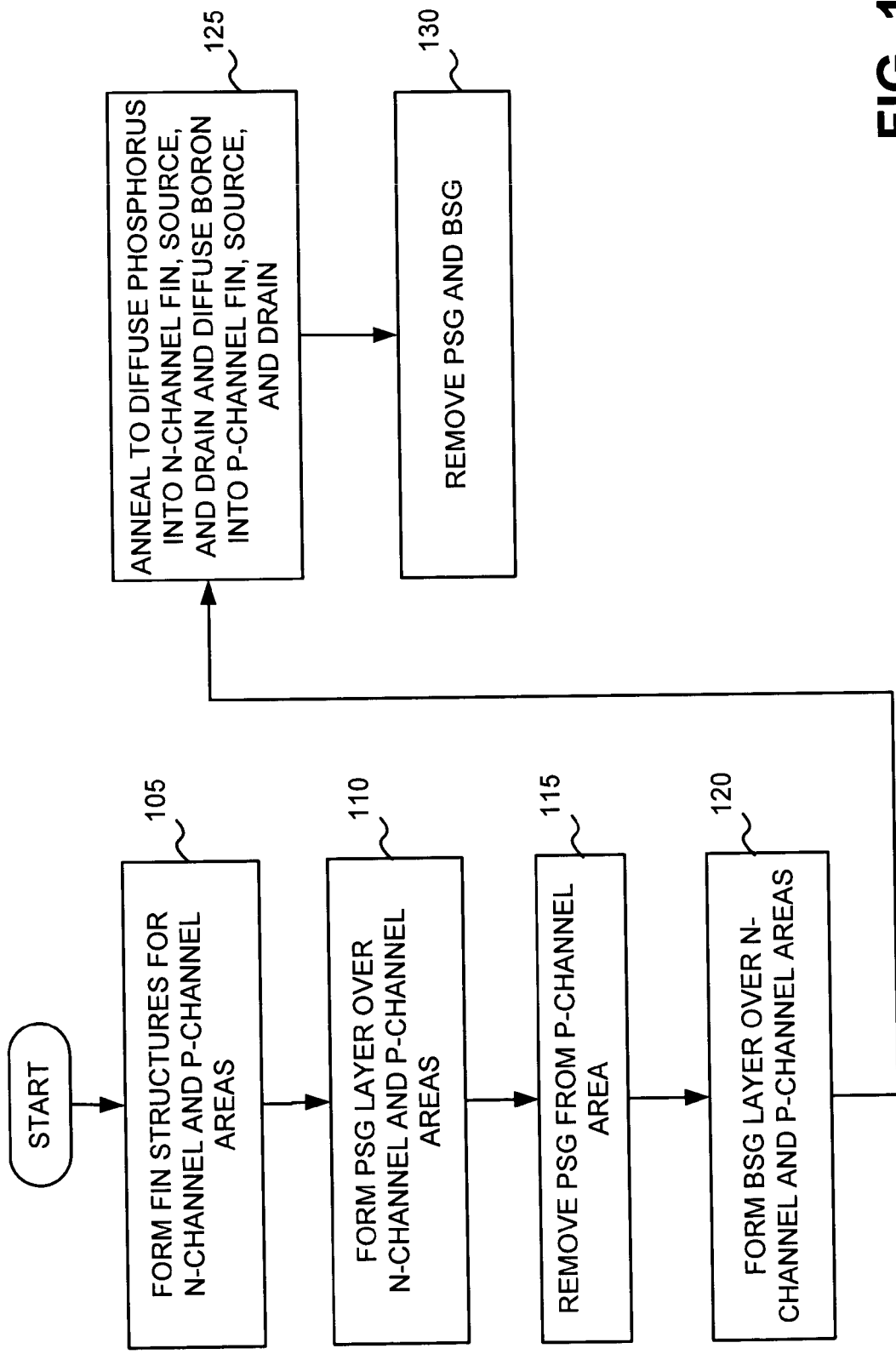
FIG. 1 illustrates an exemplary process for forming FinFET devices in an implementation consistent with the principles of the invention.

FIG. 1 illustrates an exemplary process for forming FinFET devices in an implementation consistent with the principles of the invention. FIGS. 2–7B illustrate exemplary views of FinFET devices fabricated according to the processing described in FIG. 1. The fabrication of two FinFET devices will be described hereinafter. It will be appreciated, however, that the techniques described herein are equally applicable to forming more than two devices.

Figure 2:
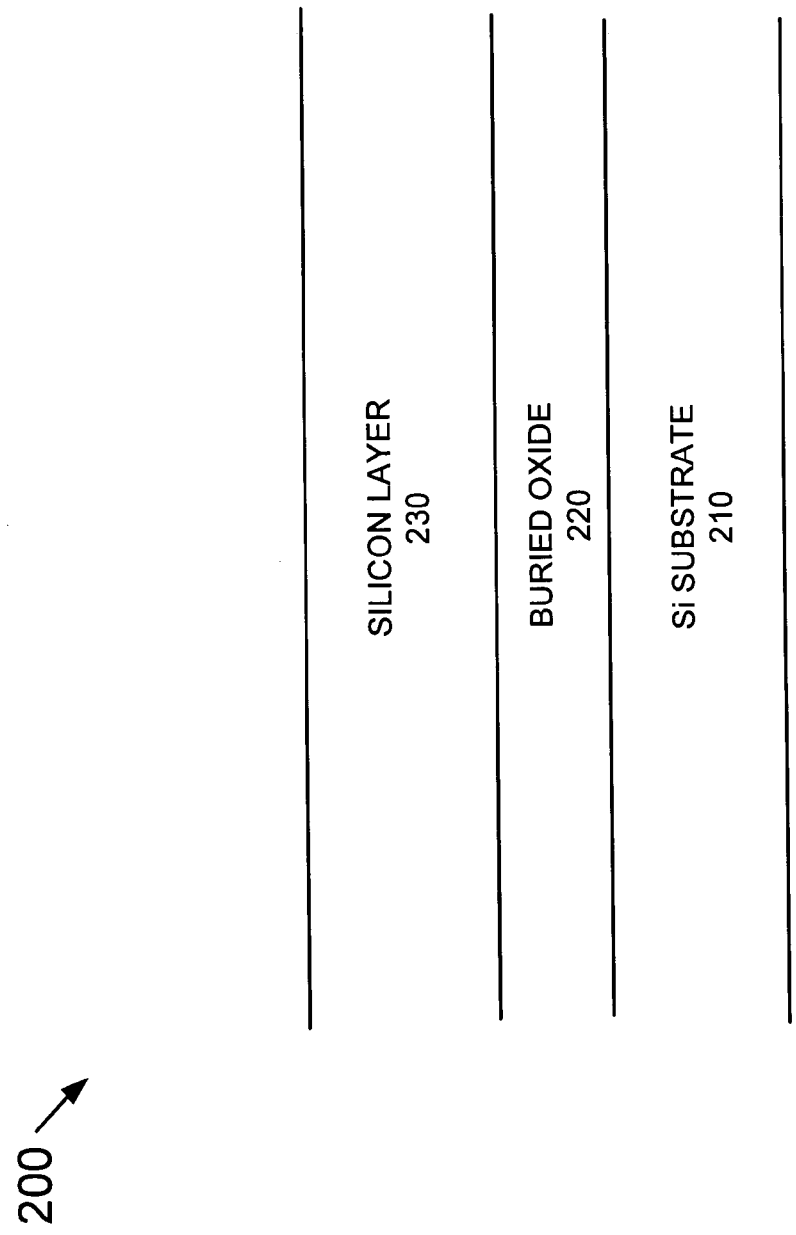
FIGS. 2–7B illustrate exemplary views of FinFET devices fabricated according to the processing described in FIG. 1.

With reference to FIGS. 1 and 2, processing may begin with a semiconductor device 200 that includes a silicon-on-insulator (SOI) structure having a silicon substrate 210, a buried oxide layer 220, and a silicon layer 230 on the buried oxide layer 220. Buried oxide layer 220 and silicon layer 230 may be formed on substrate 210 in a conventional manner.

In an exemplary implementation, buried oxide layer 220 may include a silicon oxide and may have a thickness ranging from about 1500 Å to about 3000 Å. Silicon layer 230 may include monocrystalline or polycrystalline silicon having a thickness ranging from about 200 Å to about 1000 Å. Silicon layer 230 is used to form fin structures, as described in more detail below.

In alternative implementations consistent with the present invention, substrate 210 and layer 230 may comprise other semiconducting materials, such as germanium, or combinations of semiconducting materials, such as silicon-germanium. Buried oxide layer 220 may also include other dielectric materials.

Figure 3A:
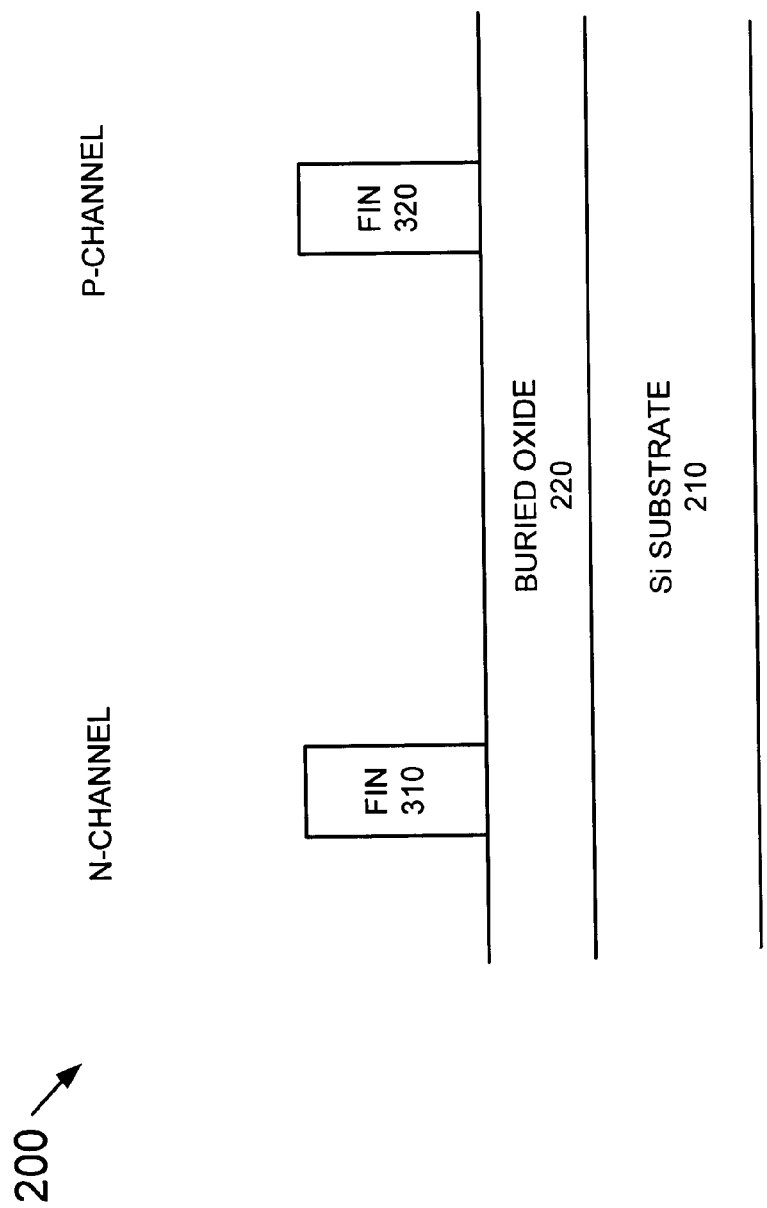
Figure 3B:
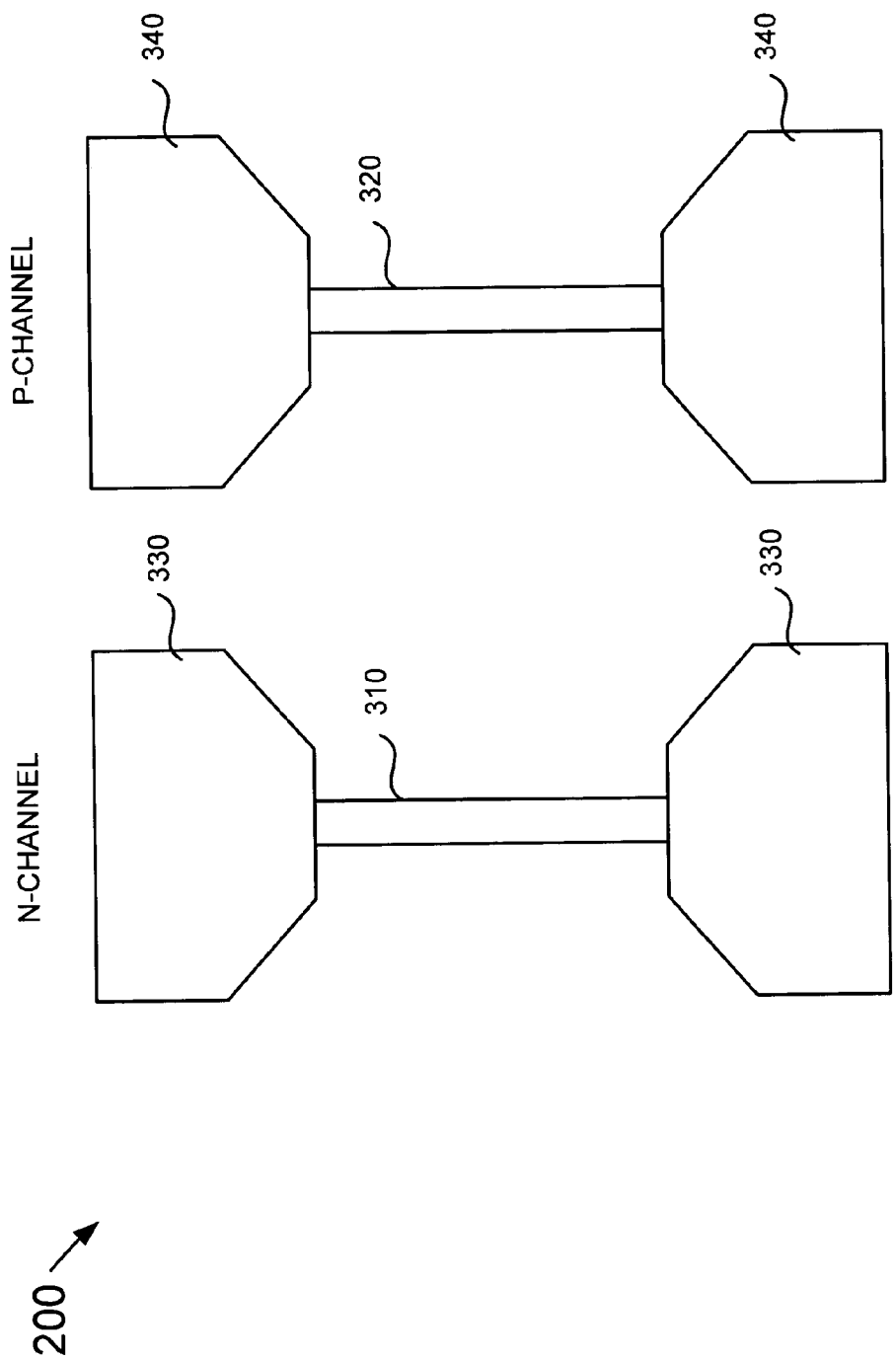

Fin structures 310 and 320 and source and drain (S/D) regions 330 and 340 may be formed on the SOI structure for an N-channel device and a P-channel device, as illustrated in FIGS. 3A (cross-sectional view) and 3B (top view) (act 105). Fin structures 310 and 320 and S/D regions 330 and 340 may be formed in a conventional manner. For example, to form fin structures 310 and 320, a photo-resist material may be deposited and patterned to form a photo-resist mask. Fin structures 310 and 320 may then be formed (e.g., via etching) using the photo-resist mask. As illustrated in FIG. 3A, one or more fin structures 310 and 320 may be formed in the N-channel area and the P-channel area. A single fin structure for each area is illustrated in FIGS. 3A and 3B for simplicity.

Figure 4:
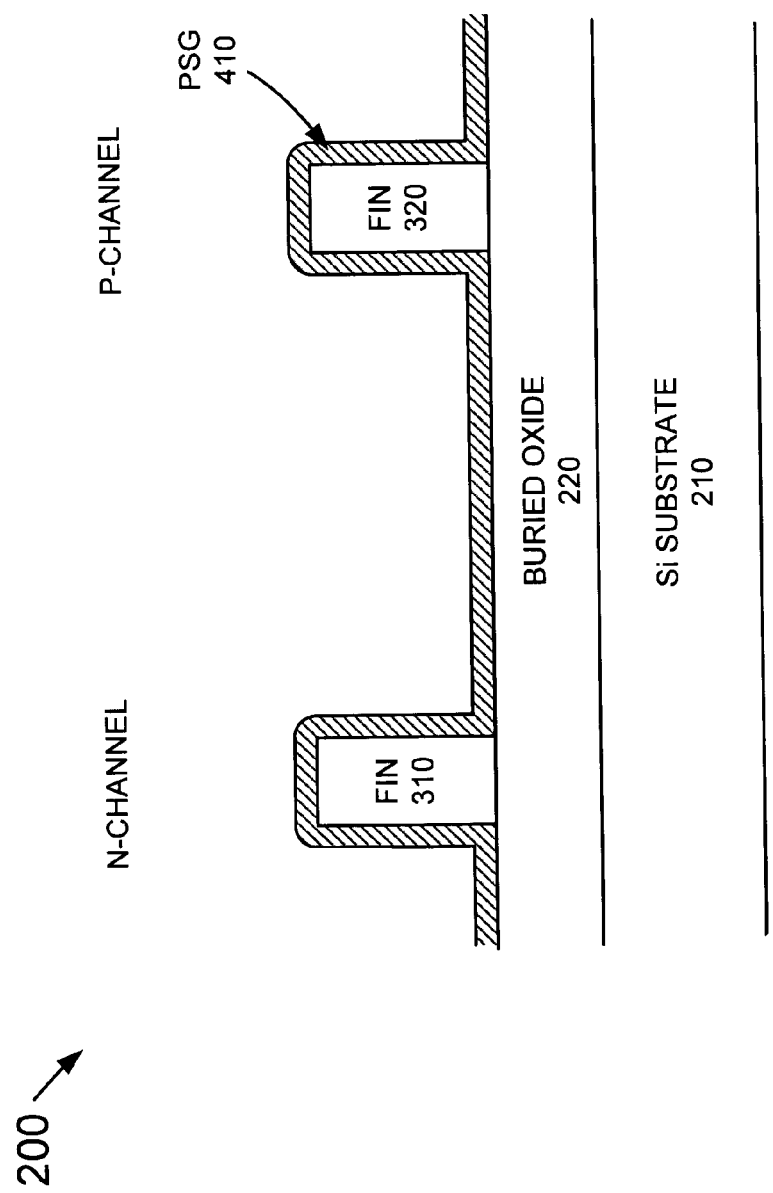

A layer of phosphosilicate glass (PSG) 410 may be formed on semiconductor device 200, as illustrated in FIG. 4 (act 110). PSG layer 410 may be deposited over fin structures 310 and 320 and S/D regions 330 and 340 in the N-channel area and the P-channel area. In one implementation, PSG layer 410 may be deposited to a thickness ranging from about 100 Å to about 500 Å. It will be appreciated that other materials may alternatively be used.

Figure 5:
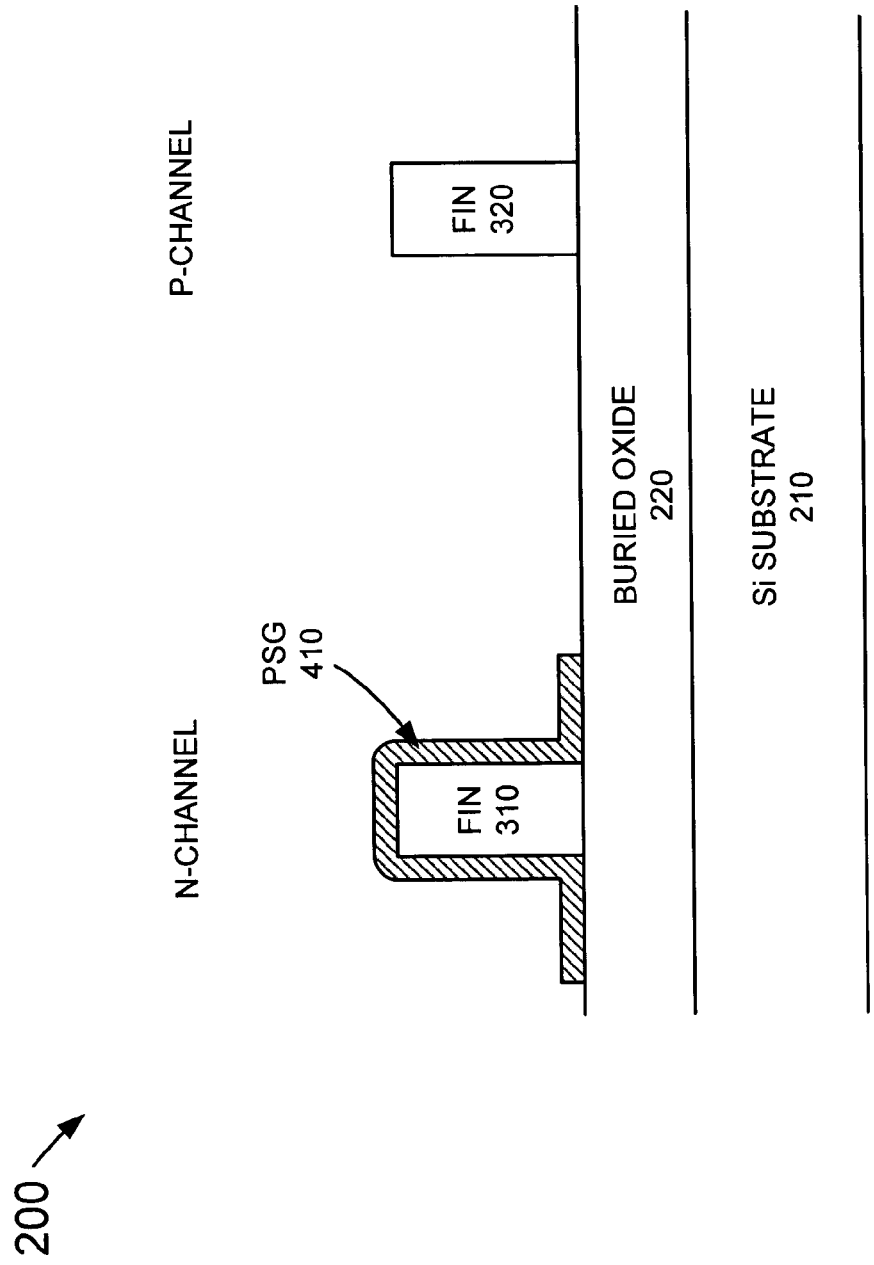

The portion of PSG layer 410 in the P-channel area may then be removed, as illustrated in FIG. 5 (act 115). To do so, the N-channel area may be masked and the portion of PSG layer 410 in the P-channel area may be removed (e.g., via etching). Although not specifically illustrated in FIG. 5, PSG layer 410 may also be removed from S/D regions 340 of the P-channel device.

Figure 6:
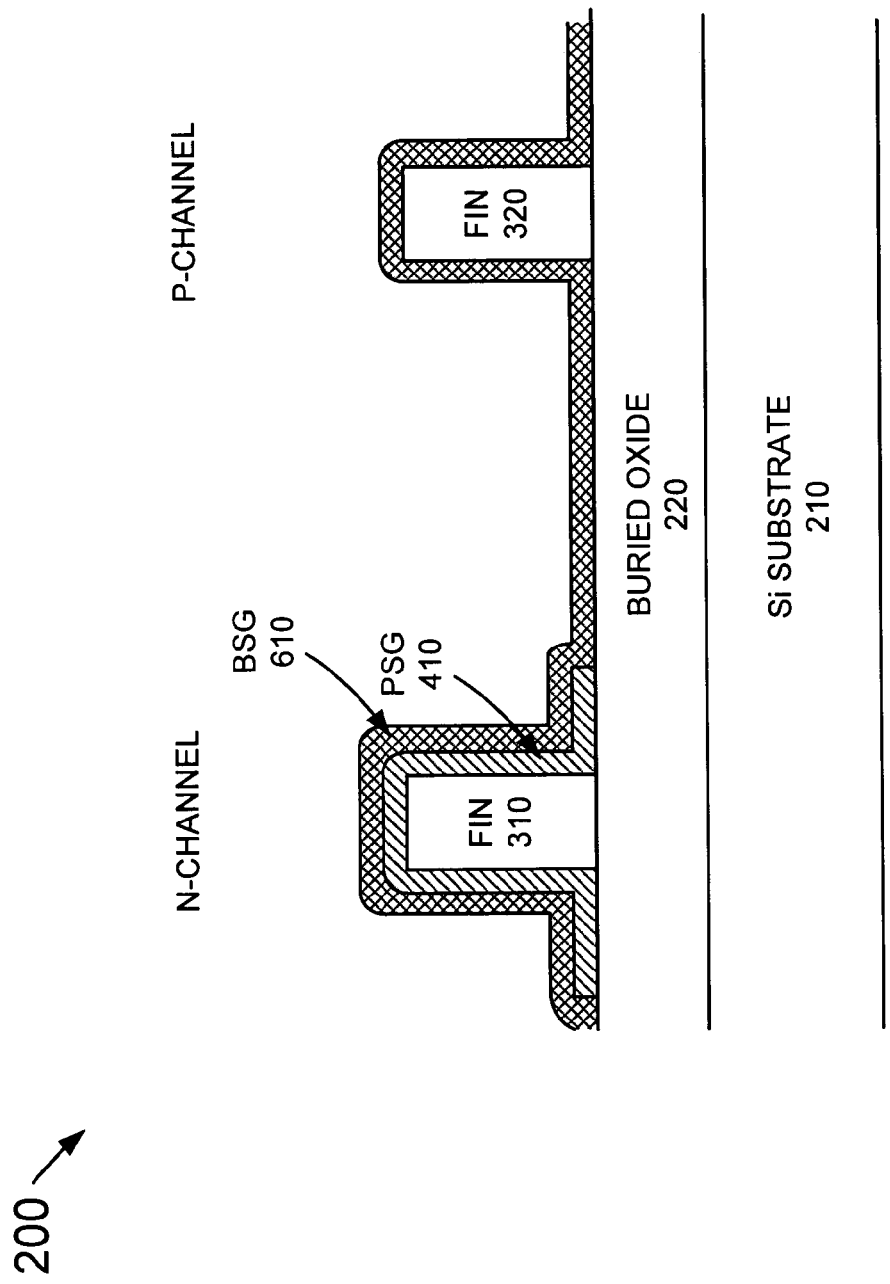

A layer of boron silicate glass (BSG) 610 may be formed on semiconductor device 200, as illustrated in FIG. 6 (act 120). BSG layer 610 may be deposited over fin structures 310 and 320 and S/D regions 330 and 340 in the N-channel area and the P-channel area. In one implementation, BSG layer 610 may be deposited to a thickness ranging from about 100 Å to about 500 Å. It will be appreciated that other materials may alternatively be used.

Figure 7A:
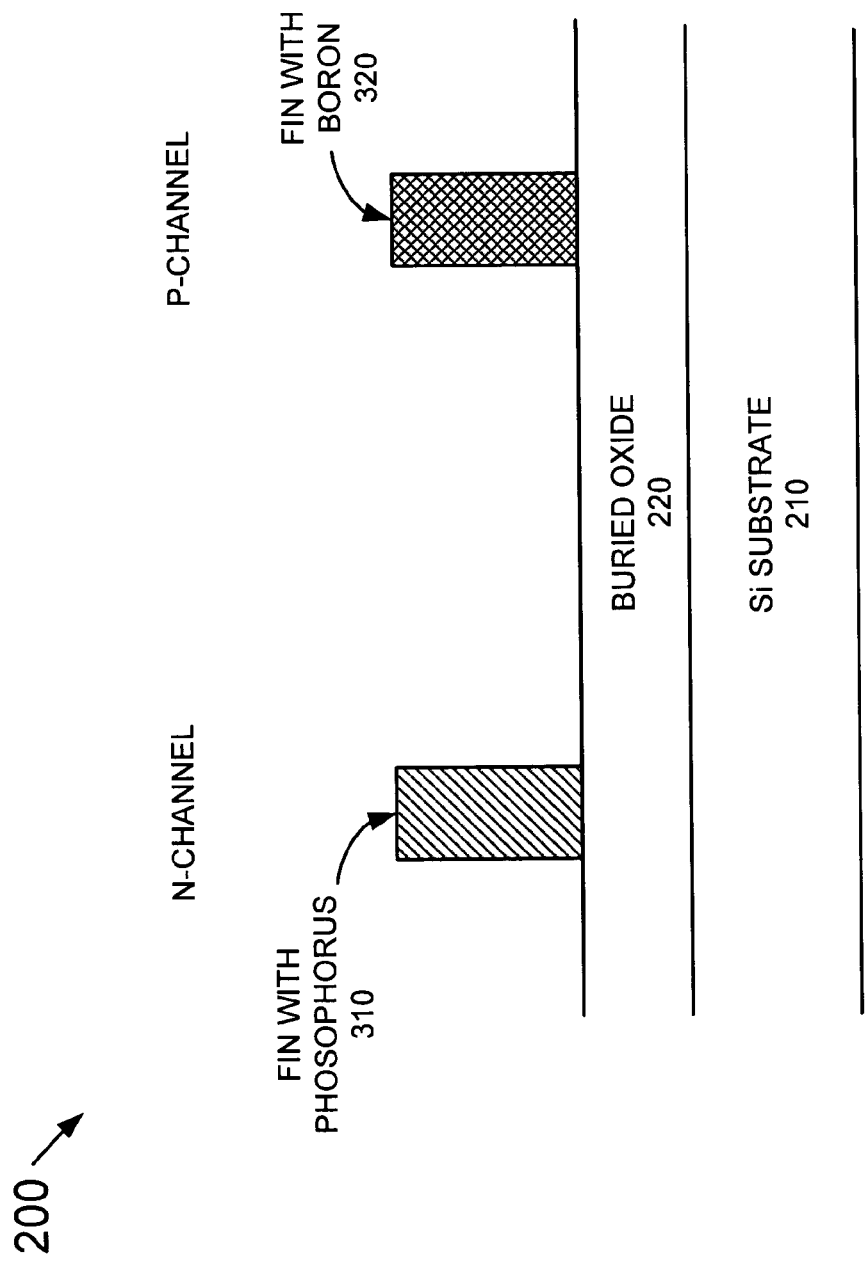
Figure 7B:
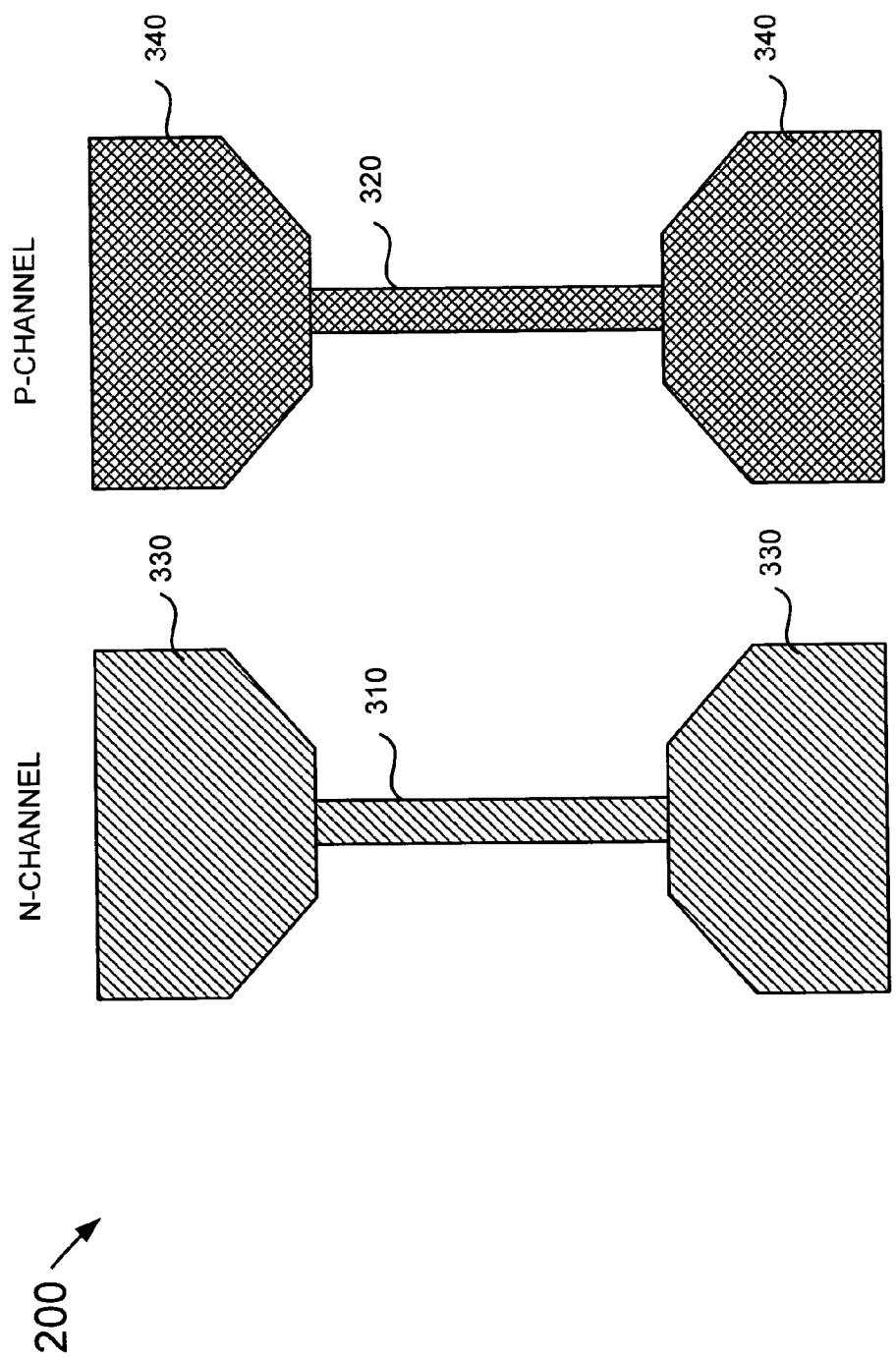

Semiconductor device 200 may be annealed to diffuse the phosphorus in PSG layer 410 into fin structure 310 and S/D regions 330 of the N-channel device and the boron in BSG layer 610 into fin structure 320 and S/D regions 340 of the P-channel device (act 125). BSG layer 610 and PSG layer 410 may then be removed, as illustrated in FIG. 7A (act 130). In one implementation, BSG layer 610 and PSG layer 410 may be removed via etching. Once BSG layer 610 and PSG layer 410 are removed, fin structures 310 and 320 are uniformly doped in the vertical direction. Moreover, S/D regions 330 and 340 in the N-channel and P-channel devices are fully doped and activated, as illustrated in FIG. 7B (top view), to produce low source-drain resistance.

Conventional fabrication processing can be performed to complete the FinFET devices. For example, a gate dielectric material may then be formed on the side surfaces of fin structures 310 and 320. The dielectric material may consist of a variety of materials, such as an oxide. A gate material may be deposited and planarized back to a desired thickness. The gate material may, for example, consist of a silicon layer, germanium layer, combinations of silicon and germanium or various metals. The gate material may then be patterned and etched to form the gate electrodes for the devices.

Thus, in accordance with the principles of the invention, fin structures can be uniformly doped throughout the fin structures. Moreover, the process described above can result in highly doped and activated junctions with very abrupt profiles.

Other Implementation

Figure 8:
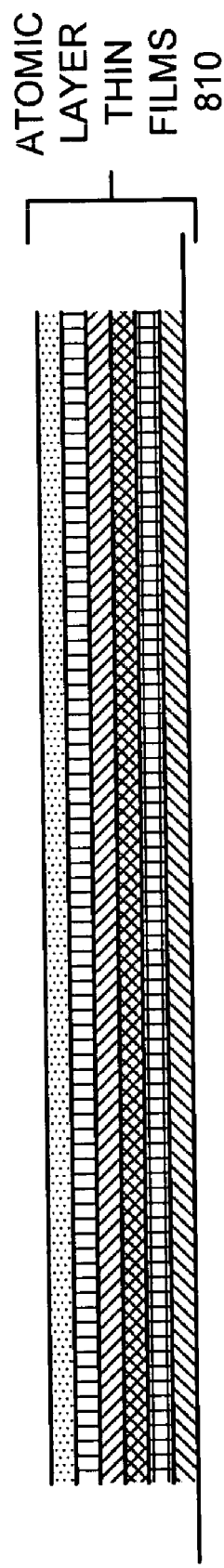
FIG. 8 illustrates exemplary atomic layer depositions according to an alternative implementation consistent with the present invention.

It may be desirable to form nanowires in a FinFET device. In such a situation, multiple atomic layer depositions may be performed to produce films 810, as illustrated in FIG. 8. Films 810 may be thin enough to generate nanowire electrical characteristics. The materials used in the formation of the nanowires may be selected based on the requirements of the end device. Each film 810 may, for example, consist of a different material. The thickness of the individual films may range from about 100 Å to about 500 Å. Thin films 810 may, in one implementation, be deposited on a buried oxide layer or other layer of a SOI structure or may be used in other parts of the FinFET device.

CONCLUSION

Implementations consistent with the principles of the invention allow for fin structures of FinFET devices to be uniformly doped by depositing doped glass over the fin structures and the S/D regions. In this manner, the S/D regions may be fully doped and activated. As a result, low source-drain resistance can be achieved.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A method for doping a fin structure and source and drain regions in FinFET devices, comprising:

forming a first glass layer on the fin structure and source and drain regions of an N-channel device and a P-channel device;

removing the first glass layer from the P-channel device;

forming a second glass layer on the fin structure and source and drain regions of the N-channel device and the P-channel device, the second glass layer being different than the first glass layer; and annealing the N-channel device and the P-channel device to uniformly dope the fin structure and to dope source and drain regions of the N-channel device and the P-channel device.

2. The method of claim 1 further comprising:

removing the second glass layer from the N-channel device and the P-channel device; and removing the first glass layer from the N-channel device.

3. The method of claim 1 wherein the first glass layer comprises phosphosilicate glass and the second glass layer comprises boron silicate glass.

4. The method of claim 3 wherein the forming a first glass layer on the N-channel device and the P-channel device includes:

depositing phosphosilicate glass to a thickness ranging from about 100 Å to about 500 Å.

5. The method of claim 4 wherein the forming a second glass layer on the N-channel device and the P-channel device includes:

depositing boron silicate glass to a thickness ranging from about 100 Å to about 500 Å.

6. The method of claim 1 wherein the removing the first glass layer from the P-channel device includes:

forming a mask on the N-channel device, and etching the first glass layer from the P-channel device.

7. A method for doping fin structures in FinFET devices, comprising:

forming a first glass layer on the fin structures of a first area and a second area;

removing the first glass layer from the second area;

forming a second glass layer on the fin structures of the first area and the second area; and annealing the first area and the second area to dope the fin structures of the first area and the second area, the annealing occurring prior to forming a gate electrode.

8. The method of claim 7 further comprising:

removing the second glass layer from the first area and the second area; and removing the first glass layer from the first area.

9. The method of claim 7 wherein the first glass layer comprises phosphosilicate glass and the second glass layer comprises boron silicate glass.

10. The method of claim 9 wherein the first area is an N-channel area and the second area is a P-channel area.

11. The method of claim 7 wherein the forming a first glass layer includes:

depositing phosphosilicate glass to a thickness ranging from about 100 Å to about 500 A.

12. The method of claim 11 wherein the forming a second glass layer includes:

depositing boron silicate glass to a thickness ranging from about 100 Å to about 500 Å.

13. The method of claim 7 wherein the annealing causes the fin structure in the first area to be doped with phosphorus and the fin structure in the second area to be doped with boron.

14. The method of claim 7 wherein the forming a first glass layer includes:

forming the first glass layer directly on the fin structures of the first area and the second area.

* * * * *